(12) United States Patent
Sanduleanu et al.

(10) Patent No.: US 7,760,028 B2
(45) Date of Patent: Jul. 20, 2010

(54) TRANSFORMER CIRCUIT

(75) Inventors: Mihai A. T. Sanduleanu, Maastricht (NL); Eduard F. Stikvoort, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 128 days.

(21) Appl. No.: 11/720,319

(22) PCT Filed: Nov. 24, 2005

(86) PCT No.: PCT/IB2005/053890

§ 371 (c)(1),
(2), (4) Date: Jun. 11, 2008

(87) PCT Pub. No.: WO2006/117599

PCT Pub. Date: Nov. 9, 2006

(65) Prior Publication Data
US 2008/0252381 A1    Oct. 16, 2008

(30) Foreign Application Priority Data
Nov. 26, 2004  (EP) .................................. 04106101

(51) Int. Cl.
*H03F 3/45*    (2006.01)

(52) U.S. Cl. ...................................................... 330/301
(58) Field of Classification Search ................. 330/260, 330/301, 311
See application file for complete search history.

(56) References Cited

U.S. PATENT DOCUMENTS 6,100,763 A * 8/2000 Durec et al. ................. 330/267
6,417,737 B1 * 7/2002 Moloudi et al. .............. 330/301

* cited by examiner

*Primary Examiner*—Steven J Mottola

(57) ABSTRACT

A BALUN circuit (20) for low voltage operation for receiving single ended input signal at an input terminal (24) and providing a differential output signal across a pair of output terminals (OUT+, OUT−) is disclosed. The BALUN circuit (20) comprises a first branch including an input terminal (24) for receiving a single ended input voltage signal (RFin), a transistor (Q1), a resistance (R1) (28), a resistance (RL), and an output terminal (OUT+). A second branch includes a transistor (Q3), a resistance (RL) and an output terminal (OUT−). An operational amplifier (26) maintains current flowing through the resistances RL in the first and second branches substantially equal to each other, in dependence upon the output voltage signal across the output terminals (OUT+, OUT−).

20 Claims, 3 Drawing Sheets

TRANSFORMER CIRCUIT

The present invention relates to unbalanced/balanced transformer (BALUN) circuits, and relates particularly, but not exclusively, to BALUN circuits for use in connecting low noise amplifiers of radio frequency (RF) equipment to mixers.

RF signals provided by antennae and low noise amplifiers are generally single ended, whereas balanced circuits are generally used in the radio frequency (RF) path of an integrated receiver/transceiver. Balanced circuits improve the immunity of the RF circuits towards common mode perturbations, and therefore are highly recommended in RF circuit design.

Although differential antennae can be used to provide balanced RF input signals, for reasons of simplicity a passive BALUN is often used to transform unbalanced antenna signals into balanced ones. However, the use of passive BALUNs has certain disadvantages. A passive BALUN is a lossy component the loss of which occurs before a low noise amplifier to which the antenna is connected. Since the insertion loss equates to the noise Fig. of the BALUN, the insertion loss of the BALUN decreases the sensitivity of the receiver. Also, BALUNs are generally expensive and insufficiently broadband to allow multi-standard architectures. In addition, an additional integrated circuit bond pad is required, increasing the chip area and the total price of the integrated device.

As an alternative to a passive BALUN, an integrated active BALUN can be used after the low noise amplifier. The active BALUN amplifies a single ended low noise amplifier (LNA) signal and provides a differential output. It is increasingly desirable for BALUNs to be able to operate at low supply voltages, for example 1.8V, since this can be important for portable applications or future SiGe BiCMOS processes where the breakdown voltage of the process may be as low as 2V. A higher transition frequency of the process also implies lower breakdown voltages. The design of low voltage BiCMOS is therefore important for future microwave applications where speed is important.

A known active BALUN, known as the micromixer BALUN, is shown in FIG. 1. The single ended voltage output of a low noise amplifier (LNA) 2 is converted into a current signal at resistor R1, and the RF current signal is equally divided between transistors Q1 and Q2. Transistor Q1 can handle large amounts of current during negative excursions of the RF input voltage, and transistors Q2, Q3 and Q4 form a current mirror which can handle large amounts of current during positive excursions of the input voltage both at its input and at its output.

The transistor Q1 and emitter resistor R2 will match transistor Q4 and emitter resistor R2. The sum of the base-emitter voltages of transistors Q1 and Q2 is constant and equal to VB. An increase of one of the currents therefore automatically produces a decrease in the other. The two half cells provide a transfer characteristic which is symmetrical to both positive and negative inputs and is also highly linear when optimised in various ways.

However, the arrangement of FIG. 1 suffers from the disadvantage that the circuit is unable to work at 1.6 volt minimum supply voltage as a result of the requirement for degeneration resistors R2 for linearity and matching purposes. In addition, there is no means for changing the phase characteristic of the circuit to obtain broadband operation, and there is no means for compensating for the current offset between the two differential parts.

Preferred embodiments of the present invention seek to overcome the above disadvantages of the prior art. In particular, it is an object of preferred embodiments of the present invention to provide an active BALUN circuit which can operate at low supply voltages.

According to the present invention, there is provided an unbalanced/balanced transformer circuit for receiving single ended input signal at an input terminal and providing a differential output signal across a pair of output terminals, the circuit comprising: a first branch including an input terminal for receiving a single ended input voltage signal, a first transistor, a first resistance connected between said input terminal and a first terminal of said first transistor to provide a current signal flowing through said first transistor, a second resistance connected to a second terminal of said first transistor for providing a voltage output signal, and an output terminal;

a second branch including at least one second transistor, a third resistance for providing an output signal dependent upon a current signal flowing through said second transistor, and an output terminal; and current matching means for maintaining current flowing through said third resistance substantially equal to the current flowing through said second resistance, in dependence upon the output voltage signal across said output terminals.

By having a first branch in which the use of degeneration resistors for the purpose of linearity and matching is avoided. This provides the advantage that the BALUN circuit of the invention can operate at lower supply voltages than the prior art. Also, by providing current matching means for maintaining current flowing through said third resistance substantially equal to the current flowing through said second resistance, in dependence upon the output voltage signal across said output terminals, this enables current offset between the first and second branches to be eliminated. This in turn enables the use of dc blocking capacitors between the BALUN and the following mixer stage to be avoided, which avoids the introduction of additional losses and phase errors into the signal path.

The current matching means may comprise voltage-sensing means for sensing voltage differences between the output terminals and providing a signal to the second transistor to adjust the current flowing therethrough.

The voltage sensing means may include a differential amplifier.

The circuit may further comprise a third transistor in said second branch connected between said third resistance and said second transistor.

This provides the advantage of reducing Miller capacitance seen at the control terminal (i.e. the base or gate) of the second transistor, as well as providing better symmetry between the first and second branches and providing equal branch impedances the emitters of the first and third transistors.

The circuit may further comprise an adjustable capacitor connected between a first terminal of said third transistor and a second terminal of the first transistor.

This provides the advantage of enabling phase errors to be adjusted.

The circuit may further comprise an adjustable capacitor connected between a first terminal of said first transistor and a second terminal of said third transistor.

Preferred embodiments of the present invention will now be described, by way of example only and not in any limitative sense, with reference to the accompanying drawings, in which.

Figure 1:
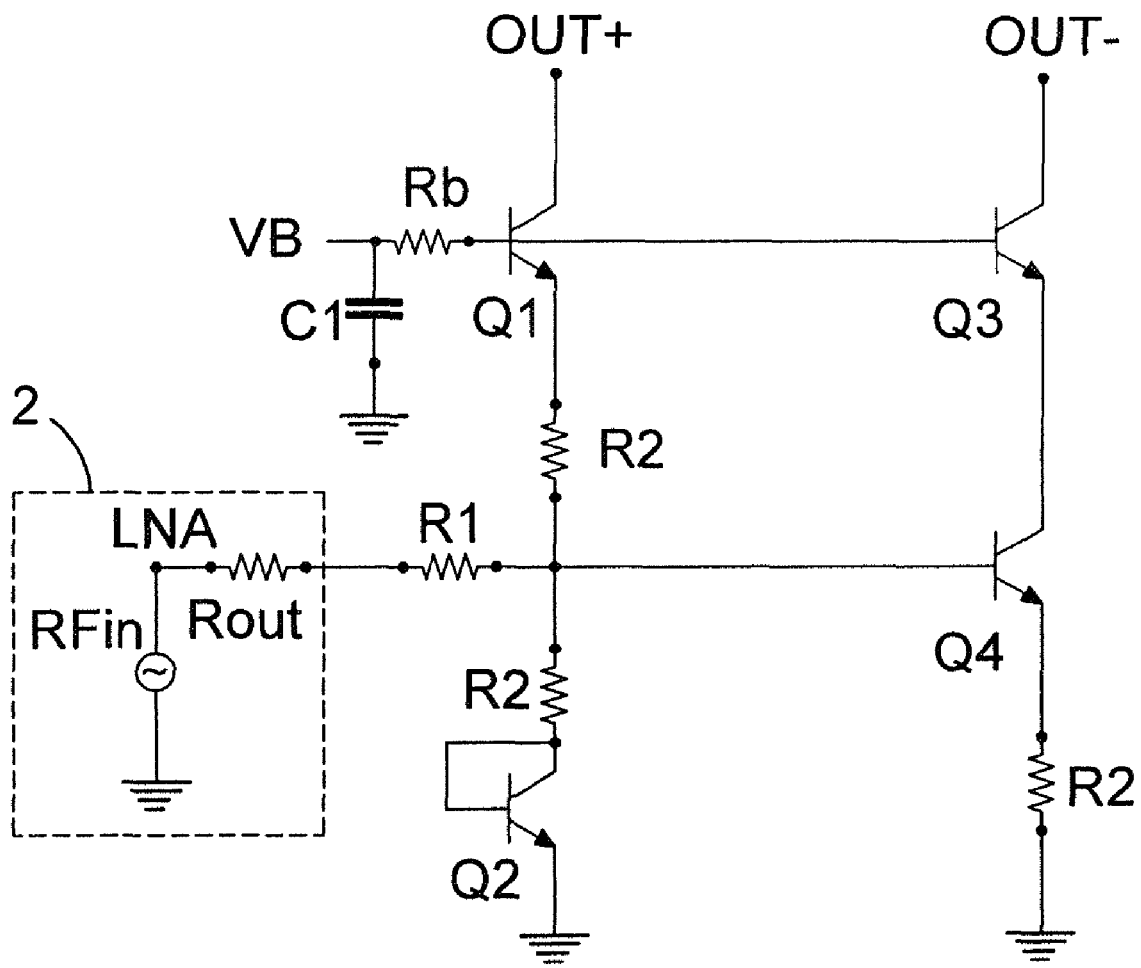
FIG. 1 is a circuit diagram of a prior art BALUN circuit.
Figure 2:
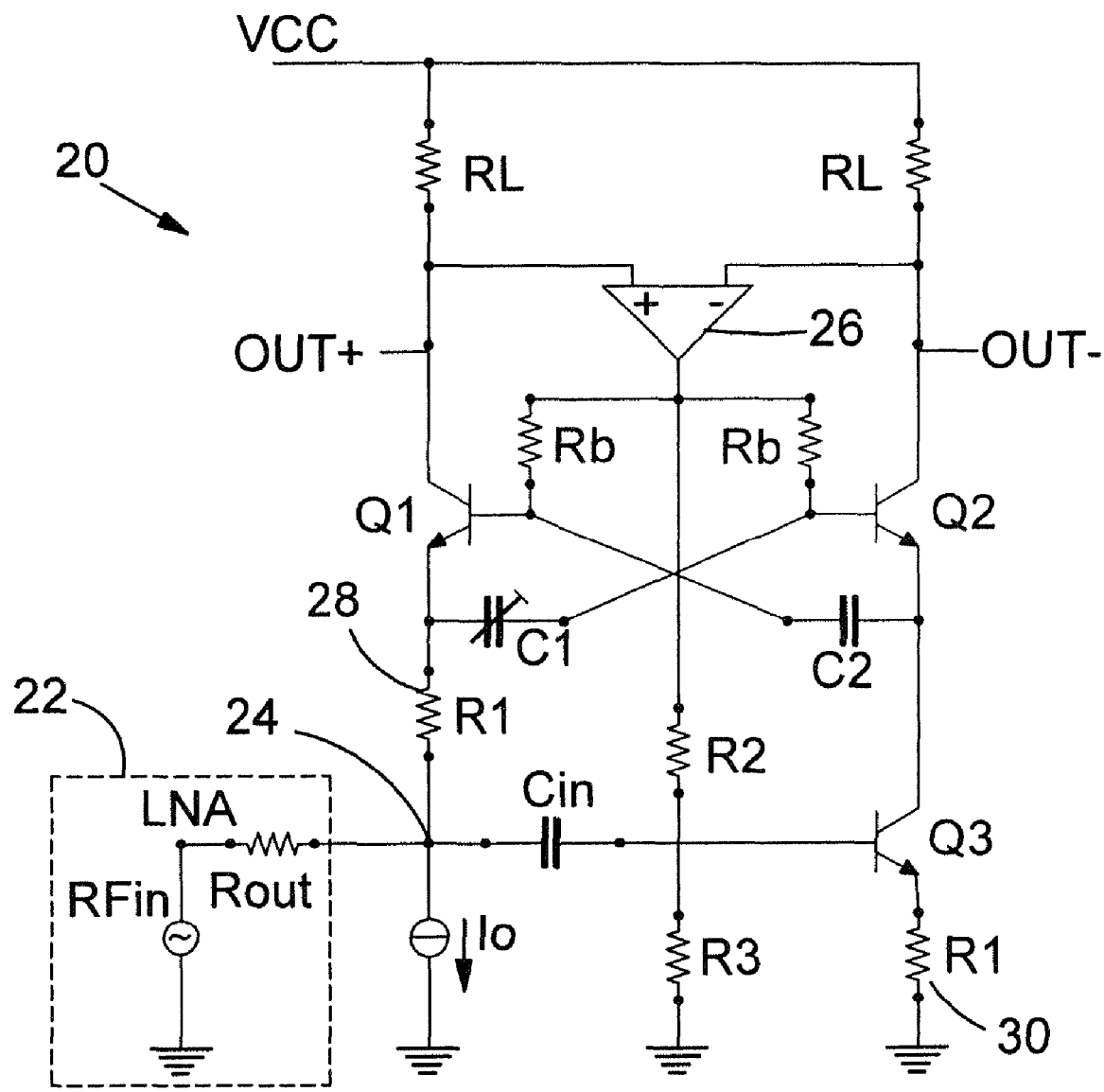
FIG. 2 is a circuit diagram of a BALUN circuit of a first embodiment of the present invention.

Referring to FIG. 2, a BALUN circuit 20 for receiving a single ended radio frequency output signal from a low noise amplifier (LNA) 22 connected to an antenna (not shown) has a first branch having a current source Io connected via input terminal 24 and resistor R1 28 to the emitter of a bipolar transistor Q1. The collector of transistor Q1 is connected via an output terminal OUT+ and resistor RL to the voltage supply rail VCC. A second branch of the BALUN circuit has a transistor Q2, the collector of which is connected to the supply rail Vcc via an output terminal OUT− and resistance RL, and the emitter of which is connected to the collector of transistor Q3. The emitter of transistor Q3 is connected via resistor R1 30 to ground.

The voltages at the output terminals OUT+, OUT− are sensed by the inputs of an operational amplifier 26, the output signal of which is applied via resistors Rb to the bases of transistors Q1, Q2 and via a voltage divider network R2, R3 to the base of transistor Q3. An input capacitor $C_{IN}$ decouples the bias voltage of the base of transistor Q3 from the input terminal. The base of transistor Q1 is connected to the emitter of transistor Q2 via capacitor C2, and the base of transistor Q2 is connected via variable capacitor C1 to the emitter of transmitter Q1.

The operation of the BALUN circuit 20 of FIG. 2 will now be described.

The current source Io provides a current through transistor Q1 and biases transistor Q1 at a current necessary for broadband operation and low distortion. The operational amplifier 26 senses the offset voltage between the two branches, which is dependent upon the offset current between the two branches, and applies its output to the base of transistor Q3, as a result of which the current flowing through transistors Q2 and Q3 matches current $I_0$. Once current $I_0$ is chosen, the total circuit is self-biased, ensuring zero offset at the output. As a result, DC blocking capacitors between the BALUN 20 and the following mixer stage (not shown) can be avoided, as a result of which the introduction of additional losses and phase errors in the signal path is avoided.

A single ended RF input signal applied to the input terminal 24 from the LNA 22 creates a current signal at resistor R1 28, as a result of which a matching current signal is provided through transistors Q2 and Q3, to cause a balanced voltage signal to be provided at the output terminals OUT+, OUT−. The sum of the base-emitter voltages of transistors Q1 and Q3 is constant, giving a constant product of the currents of Q1 and Q3.

The resistor R1 28 provides the correct input resistance for maximum power transfer from the low noise amplifier 22 to the BALUN 20. At the same time, it assists the matching of transistors Q1 and Q3. Transistor Q2 decreases the Miller capacitance observed at the base of transistor Q3, and enhances the isolation between the mixer (not shown) and low noise amplifier 22. Transistor Q2 also provides better symmetry between the two branches of the circuit and provides equal branch impedances at the emitters of transistors Q1 and Q2.

Capacitors C1, C2 provide a means for adjusting the phase error of the two anti-phase outputs. If C1 is adjusted, the anti-phase operation can be extended to a larger frequency range, at the cost of a (usually acceptable) phase error at the output. A CMOS operational amplifier 26 with PMOS inputs is a suitable amplifier for this purpose.

Figure 3:
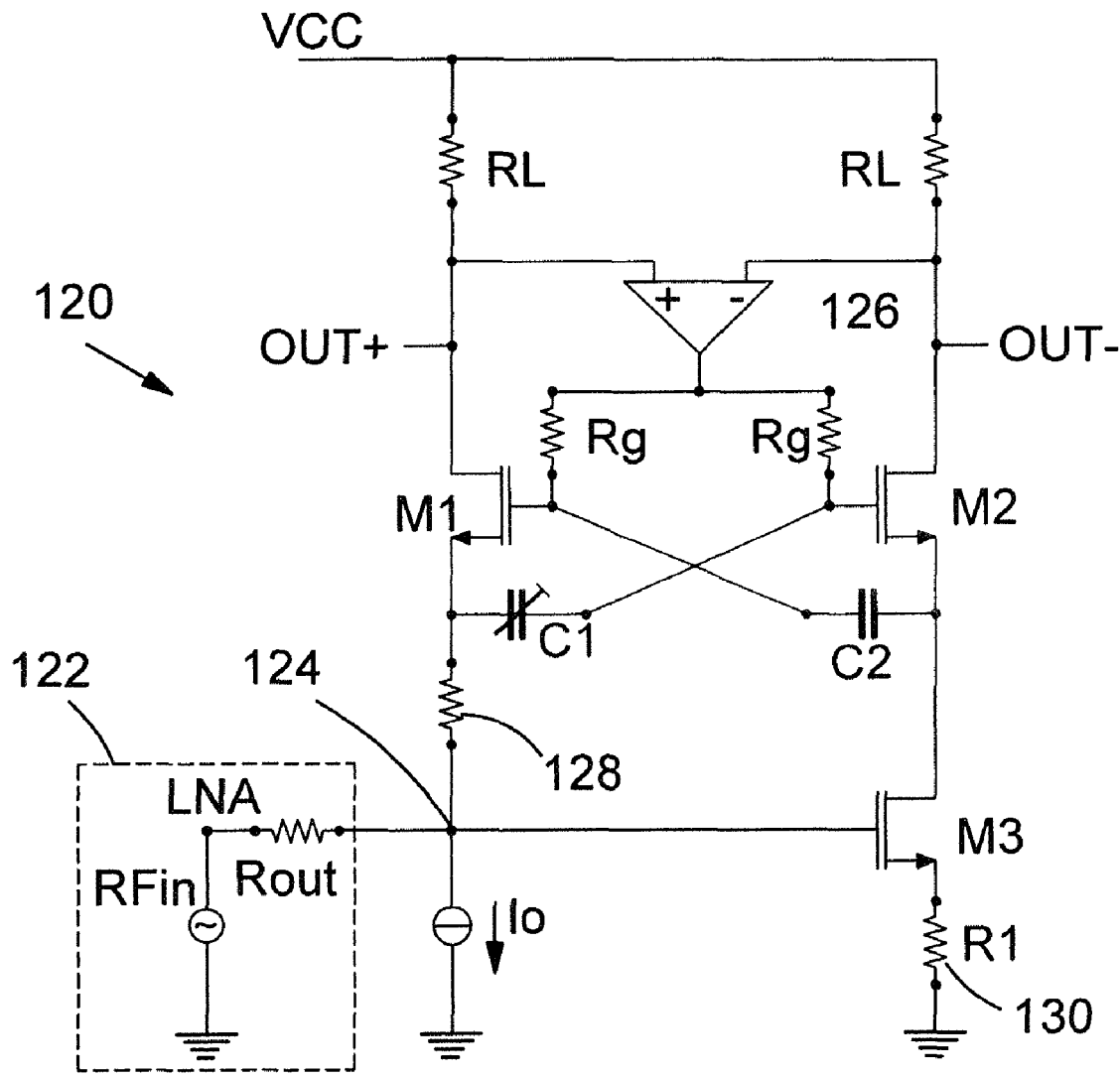
FIG. 3 is a circuit diagram of a BALUN circuit of a second embodiment of the present invention.

Referring to FIG. 3, in which parts common to the embodiment of FIG. 2 are denoted by like reference numerals but increased by 100, an MOS version of the BALUN circuit of FIG. 2 is shown. In the case of the MOS BALUN 120, no equivalent to the input capacitor Cin between the input terminal 124 and the base of transistor Q3 of FIG. 2 is necessary.

It will be appreciated by persons skilled in the art that the above embodiments have been described by way of example only, and not in any limitative sense, and that various alternations and modifications are possible without departure from the scope of the invention as defined by the appended claims.

The invention claimed is:

1. An unbalanced/balanced transformer circuit for receiving single ended input signal at an input terminal and providing a differential output signal across a pair of output terminals, the circuit comprising:

a first branch including an input terminal for receiving a single ended input voltage signal, a first transistor, a first resistance connected between said input terminal and a first terminal of said first transistor to provide a current signal flowing through said first transistor, a second resistance connected to a second terminal of said first transistor for providing a voltage output signal, and an output terminal;

a second branch including at least one second transistor, a third resistance for providing an output signal dependent upon a current signal flowing through said second transistor, and an output terminal; and current matching means for maintaining current flowing through said third resistance substantially equal to the current flowing through said second resistance, in dependence upon the output voltage signal across said output terminals, wherein the current matching means comprises voltage-sensing means for sensing voltage differences between the output terminals and providing a signal to the second transistor to adjust the current flowing therethrough.

2. A circuit according to claim 1, wherein the voltage-sensing means includes a differential amplifier.

3. A circuit according to claim 1, further comprising a third transistor in said second branch connected between said third resistance and said second transistor.

4. A circuit according to claim 3, further comprising an adjustable capacitor connected between a first terminal of said third transistor and the first terminal of the first transistor.

5. A circuit according to claim 3, further comprising an adjustable capacitor connected between a third terminal of said first transistor and a second terminal of said third transistor.

6. A circuit according to claim 1, further comprising an input capacitor connected between the input terminal and a second terminal of the second transistor.

7. A circuit according to claim 1, further comprising a voltage divider circuit connected to the current matching means and the second transistor.

8. An unbalanced/balanced transformer circuit for receiving single ended input signal at an input terminal and providing a differential output signal across a pair of output terminals, the circuit comprising:

a first branch including an input terminal for receiving a single ended input voltage signal, a first transistor, a first resistance connected between said input terminal and a first terminal of said first transistor to provide a current signal flowing through said first transistor, a second resistance connected to a second terminal of said first transistor for providing a voltage output signal, and an output terminal;

a second branch including at least one second transistor, a third resistance for providing an output signal dependent upon a current signal flowing through said second transistor, a third transistor connected between the third resistance and the second transistor, and an output terminal;

an adjustable capacitor connected between a first terminal of said third transistor and the first terminal of the first transistor; and current matching means for maintaining current flowing through said third resistance substantially equal to the current flowing through said second resistance, in dependence upon the output voltage signal across said output terminals.

9. A circuit according to claim 7, wherein the current matching means comprises voltage-sensing means for sensing voltage differences between the output terminals and providing a signal to the second transistor to adjust the current flowing therethrough.

10. A circuit according to claim 9, wherein the voltage-sensing means includes a differential amplifier.

11. A circuit according to claim 7, further comprising an adjustable capacitor connected between an adjustable capacitor connected between a third terminal of said first transistor and a second terminal of said third transistor.

12. A circuit according to claim 7, further comprising an input capacitor connected between the input terminal and a second terminal of the second transistor.

13. A circuit according to claim 7, further comprising a voltage divider circuit connected to the current matching means and the second transistor.

14. A circuit according to claim 7, further comprising a resistor connected between the current matching means and a first terminal of the second transistor.

15. An unbalanced/balanced transformer circuit for receiving single ended input signal at an input terminal and providing a differential output signal across a pair of output terminals, the circuit comprising:

a first branch including an input terminal for receiving a single ended input voltage signal, a first transistor, a first resistance connected between said input terminal and a first terminal of said first transistor to provide a current signal flowing through said first transistor, a second resistance connected to a second terminal of said first transistor for providing a voltage output signal, and an output terminal;

a second branch including at least one second transistor, a third resistance for providing an output signal dependent upon a current signal flowing through said second transistor, a third transistor connected between the third resistance and the second transistor, and an output terminal;

an adjustable capacitor connected between a third terminal of the first transistor and a second terminal of the third transistor; and current matching means for maintaining current flowing through said third resistance substantially equal to the current flowing through said second resistance, in dependence upon the output voltage signal across said output terminals.

16. A circuit according to claim 15, wherein the current matching means comprises voltage-sensing means for sensing voltage differences between the output terminals and providing a signal to the second transistor to adjust the current flowing therethrough.

17. A circuit according to claim 16, wherein the voltage-sensing means includes a differential amplifier.

18. A circuit according to claim 15, further comprising an input capacitor connected between the input terminal and a second terminal of the second transistor.

19. A circuit according to claim 15, further comprising a voltage divider circuit connected to the current matching means and the second transistor.

20. A circuit according to claim 15, further comprising a resistor connected between the current matching means and a first terminal of the second transistor.

* * * * *